US008461691B2

(12) United States Patent
Meyer (10) Patent No.: US 8,461,691 B2
(45) Date of Patent: Jun. 11, 2013

(54) CHIP-PACKAGING MODULE FOR A CHIP AND A METHOD FOR FORMING A CHIP-PACKAGING MODULE

(75) Inventor: Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/097,127

(22) Filed: Apr. 29, 2011

(65) Prior Publication Data

US 2012/0273957 A1 Nov. 1, 2012

(51) Int. Cl.
  *H01L 23/52* (2006.01)
  *H01L 23/48* (2006.01)
  *H01L 29/40* (2006.01)
  *H01L 23/02* (2006.01)

(52) U.S. Cl.
  USPC ........... 257/774; 257/773; 257/686; 257/738; 257/780

(58) Field of Classification Search
  USPC .................... 257/773, 774, 686, 738, 780
  See application file for complete search history.

(56) References Cited

U.S. PATENT DOCUMENTS

| | | | | |
|---|---|---|---|---|
| 6,964,887 | B2 * | 11/2005 | Akagawa | 438/126 |
| 7,180,149 | B2 * | 2/2007 | Yamamoto et al. | 257/434 |
| 7,247,948 | B2 | 7/2007 | Hedler et al. | |
| 7,265,451 | B2 * | 9/2007 | Hedler et al. | 257/777 |
| 7,420,128 | B2 * | 9/2008 | Sunohara et al. | 174/260 |
| 7,498,249 | B2 * | 3/2009 | Miyazaki et al. | 438/597 |
| 7,547,965 | B2 * | 6/2009 | Hsu | 257/698 |
| 7,563,652 | B2 * | 7/2009 | Yang et al. | 438/126 |
| 7,589,410 | B2 * | 9/2009 | Kim | 257/686 |
| 7,807,512 | B2 * | 10/2010 | Lee et al. | 438/127 |
| 7,834,464 | B2 * | 11/2010 | Meyer et al. | 257/777 |
| 7,858,440 | B2 | 12/2010 | Pressel et al. | |
| 2001/0010627 | A1 * | 8/2001 | Akagawa | 361/761 |
| 2005/0046002 | A1 * | 3/2005 | Lee et al. | 257/678 |
| 2005/0056903 | A1 * | 3/2005 | Yamamoto et al. | 257/433 |
| 2006/0131283 | A1 | 6/2006 | Hall et al. | |
| 2008/0135977 | A1 * | 6/2008 | Meyer et al. | 257/531 |
| 2008/0283971 | A1 * | 11/2008 | Huang et al. | 257/620 |
| 2009/0039491 | A1 * | 2/2009 | Kim et al. | 257/686 |
| 2009/0166843 | A1 | 7/2009 | Kutter et al. | |
| 2009/0294949 | A1 | 12/2009 | Meyer | |
| 2010/0062563 | A1 | 3/2010 | Pressel et al. | |
| 2010/0073663 | A1 | 3/2010 | Meyer | |
| 2012/0168942 | A1 * | 7/2012 | Gan et al. | 257/738 |
| 2012/0168944 | A1 * | 7/2012 | Gan et al. | 257/738 |

OTHER PUBLICATIONS

"Application of Through Mold Via (TMV) as PoP base package"; Jinseong Kim et al., Amkor Technology Korea Inc., Seoul; Christopher Scanlan, Amkor Technology Inc., Chandler, Korea; pp. 1-5, (May 2008).
"How 3D is Stacking Up", George A. Riley, PhD, http://www.electroiq.com/ElectroIQ/en-us/index/display/Packaging_Article_Tools_Template.articles.advanced-packaging.volume-17.issue-10.features.how-3d-is-stacking-up.html; pp. 1-5, (Mar. 2011).
"Joint Project for Mechanical Qualification of Next Generation High Density Package-on-Package (PoP) with Through Mold via Technology", Moody Dreiza et al., Amkor Technology; Didier Campos et al. of ST Microelectronics; Pauli Jarvinen of Nokia; EMPC2009—17th European Microelectronics & Packaging Conference, Jun. 16th Rimini, Italy; pp. 1-8 (Jun. 2009).

* cited by examiner

*Primary Examiner* — Luan C Thai (57) ABSTRACT

A chip-packaging module for a chip is provided, the chip-packaging module including an isolation material configured to cover a chip on at least one side, the isolation material having a first surface proximate to a first side of a chip, and said isolation material having a second surface facing an opposite direction to the first surface; and at least one layer in connection with the chip first side, the at least one layer further configured to extend from the chip first side to the second surface of the isolation material.

23 Claims, 11 Drawing Sheets

Prior Art

Prior Art

Prior Art

Prior Art

| Forming at least one sidewall through an isolation material, the isolation material configured to cover a chip on at least one side, the isolation material having a first surface proximate to a chip first side, and said isolation material having a second surface facing an opposite direction to the first surface; the sidewall configured at an oblique angle to the first surface of the isolation material the sidewall having direct line of sight to an opening at the first surface defined by the at least one sidewall; — 8002 |

| Depositing in a single step at least one layer in connection with a chip first side and over at least one sidewall, the layer extending from the chip first side to the second surface of the isolation material. — 8004 |

Fig. 9

CHIP-PACKAGING MODULE FOR A CHIP AND A METHOD FOR FORMING A CHIP-PACKAGING MODULE

TECHNICAL FIELD

Various embodiments relate generally to a chip-packaging module and a method for forming a chip-packaging module.

BACKGROUND

Stackable packages are currently a focus in the market of chip-packaging for packaging chips used in logic applications, mobile applications and consumer electronics. For such applications and consumer electronics, package-on-package (PoP) stacks are used so that packages can be tested before stacking. For embedded wafer level package technology (eWLP), e.g., embedded wafer level Ball grid array BGA (eWLB) technology, an embedded package-on-package (ePoP) version will be required in future. An ePoP may form the base package of the stack. Solder paste may be applied to a printed circuit board (PCB), and a bottom package, e.g. an embedded wafer level ball grid array, may be placed into the solder paste. Solder paste may be applied to the top of the ePOP. A standard BGA, e.g. a wire bonded or flip-chip BGA, or a wafer level ball grid array may be assembled on top of the ePoP package by placing the top package onto the ePOP. A reflow may then be carried out to attach the packages together. During the reflow the top package may then be connected to the bottom package.

The interconnection from a top package through an ePOP base or bottom package to the main board may be a vertical interconnection carried out in two different methods.

A first method makes use of via bars, using through-silicon via (TSV) technology or using PCB technology.

Figure 1A:
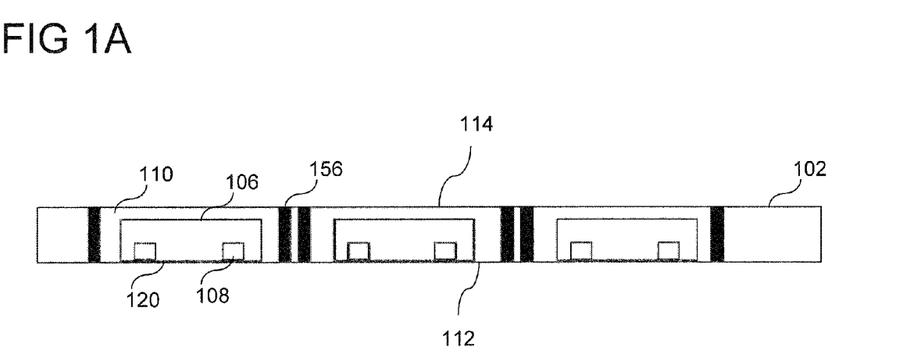
FIGS. 1A and 1B show the use of via bars as interconnects between the top to bottom of a chip package.
Figure 1B:
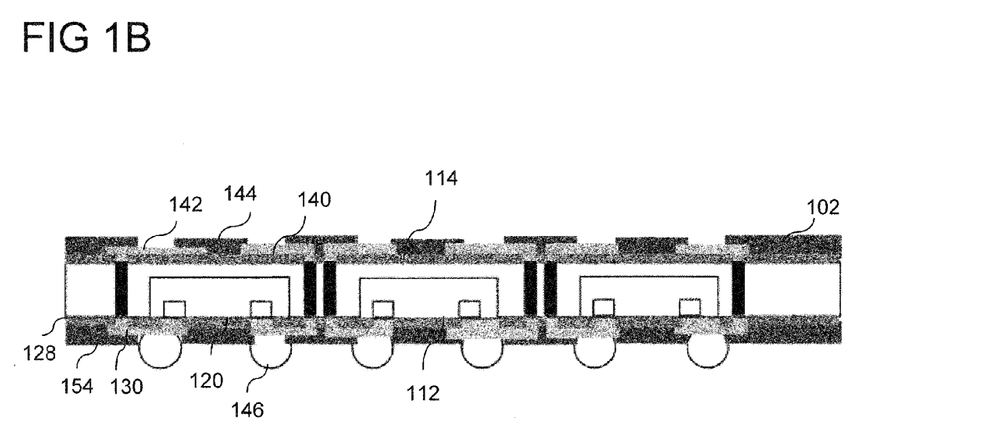

FIGS. 1A and 1B show how via bars may be used for providing a vertical interconnection from a top package to a bottom package. In this method, via bars 156, e.g. via bars comprising electrically conductive via connections, e.g. copper via connections from a package top 114 to bottom 112 side in a standard PCB board, may be placed into a package 102 prior to molding. Thus via bars 156 may already be pre-manufactured to establish a connection from the top 114 to the bottom 112 of package 102 even before a redistribution line is applied and may be pre-tested to guarantee a "known-good-via". Each chip 106 may have one or more connection pads 108 formed at chip first side 120 here oriented to face the bottom 112 of package 102. The process is typically less flexible due to the pre-determined configuration of via bars 156.

Typically one, two or four via bars may be used for all interconnects, and smaller groups of via bars may not be possible. Moreover, via bars may be expensive. Silicon bars with TSVs or PCB bars may also be used, with PCB bars being the cheaper alternative to silicon bars. However, sufficiently high aspect ratio of via bars in this method may also be difficult to achieve as the via bars tend to be thick. The process has further difficulties because it relies on picking and placing the via bars in specific locations which may be difficult to control. The molding process is also difficult because via bar shifting during the molding process is very likely. Additional process steps for fixing the via bars may therefore be needed before the molding process.

After a mold material 110 is applied, top side 114 of package 102 may be ground to expose the interconnects. With reference to FIG. 1B, thin-film passivation layer 128, redistribution layer (RDL) 130 and solder stop layer 154 may be applied at chip first side 120 and/or package bottom side 112. Further thin-film passivation layer 140, further redistribution layer (RDL) 142 and further solder stop layer 144 may be applied to package top side 114. A solder ball 146 may be attached to redistribution layer 130 located on chip first side 120 and/or package bottom side 112. Due to the large dimensions of via bars, the process may result in a large package.

Figure 2A:
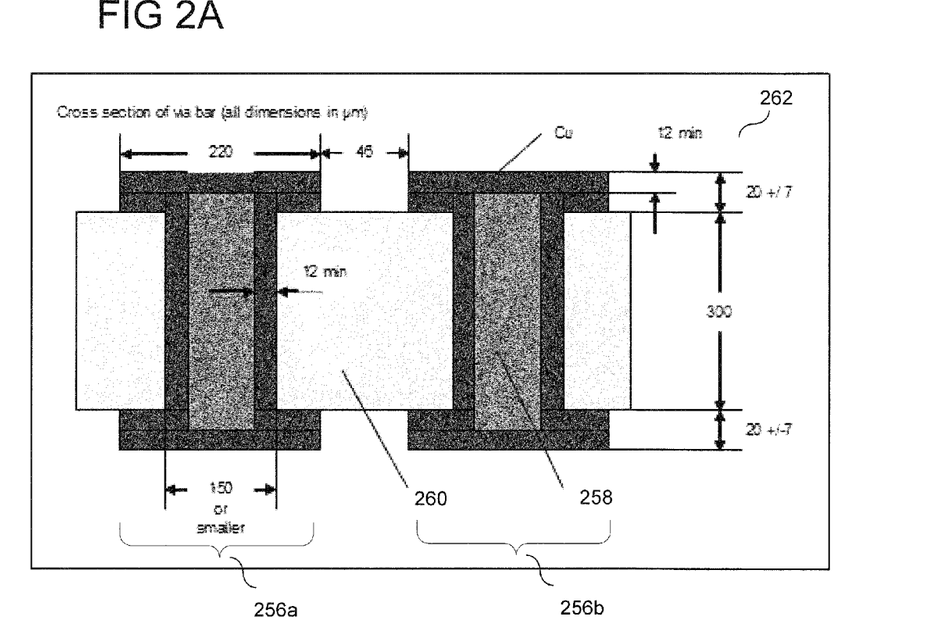
FIGS. 2A and 2B show the dimensions and design of via bars as interconnects between the top to bottom of a chip package.
Figure 2B:
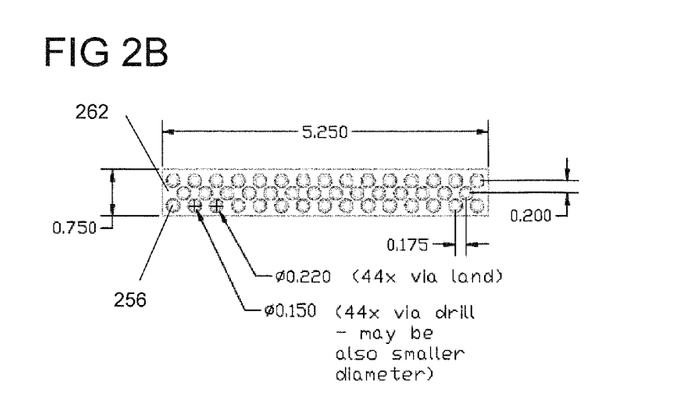

FIGS. 2A and 2B show illustrations of the use of via bars, e.g. conductive via bars, wherein the dimensions of exemplary via bars 262 are shown in μm. FIG. 2A shows two vias 256a, 256b comprising copper, each having a width of approximately maximally 150 μm formed adjacent each other. Each via may further comprise a hole plug material 258 which may have a width of approximately 125 μm. A Bismaleimide-Triazine epoxy (BT) or FR-4 polymer core area 260 may be the carrier material for the vias 256a, 256b. FIG. 2B shows a top-down view of via bar 262 having an array of vias 256 wherein the distance between each via may be approximately 175 to 200 μm.

In a second method, instead of using pre-fabricated via bars, prior to the mold-formation process, a etch process may be carried out to etch either through silicon to create a through silicon via (TSV) using a through-silicon via wet etch, or by laser drilling through the silicon or a mold component of the eWLB to create a through mold via (TMV) outside the chip. In the latter case, an overmolding process, i.e. forming a mold to isolate a chip may be carried out before the via etch and via fill processes. Both interconnect methods, TSV and TMV may be realized within the package area.

Figure 3A:
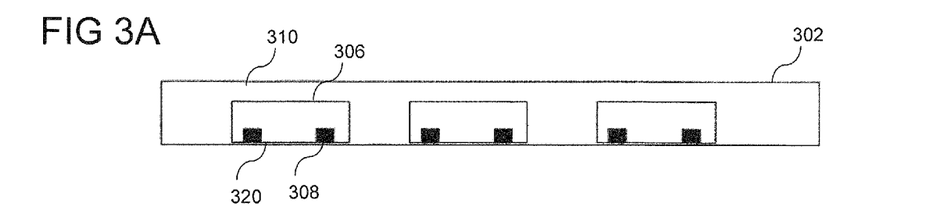
FIGS. 3A to 3D show the process of manufacturing filled laser drilled vias for interconnects between the top to bottom of a chip package.
Figure 3B:
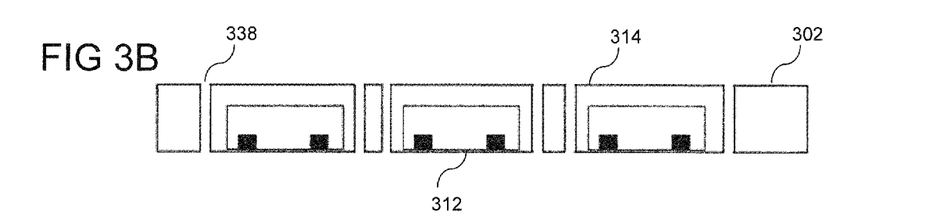
Figure 3C:
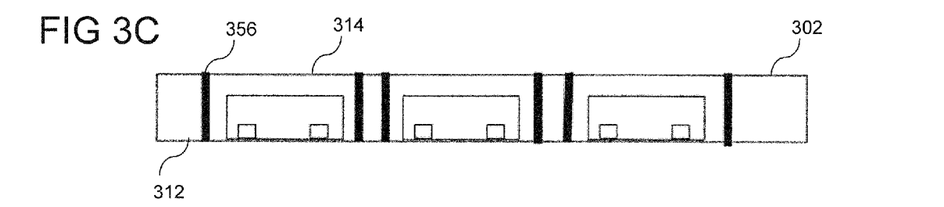
Figure 3D:
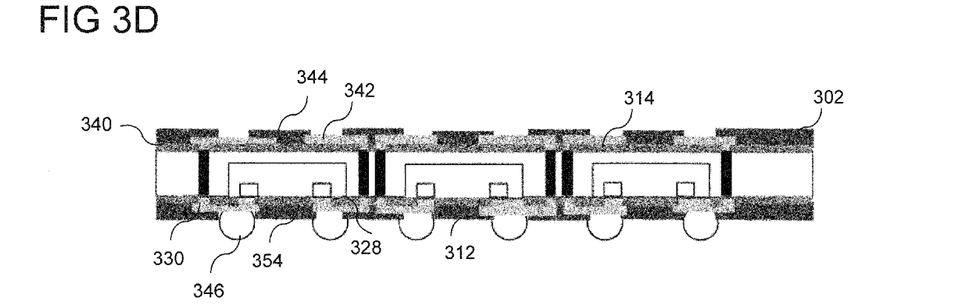

FIGS. 3A to 3D show the steps involved in TMV via creation such as by laser drilling in mold compounds. A chip 306 having one or more connection pads 308 at the first side 320 of chip 306 may be surrounded by a mold material 310, as shown in FIG. 3A. Via holes 338 may be drilled using a laser to create straight substantially vertical and parallel via holes 338, which may be formed substantially perpendicular to chip package bottom side 312 and top side 314, as shown in FIG. 3B. Via holes 338 may then be filled with a material 356 and further passivated, as shown in FIG. 3C. Chip package 302 may have a package bottom side 312 and package top side 314, as shown in FIG. 3D. Thin-film passivation layer 328, redistribution layer (RDL) 330 and solder stop layer 354 may be applied at the chip first side 320 and/or package bottom side 312. Further thin-film passivation layer 340, further redistribution layer (RDL) 342 and further solder stop layer 344 may be applied at package top side 314. Solder ball 346 may be attached to redistribution layer 330 located on the chip first side 320 and/or package bottom side 312, forming an embedded wafer level ball grid array package.

In the case wherein a TSV via may be created through silicon, it may be isolated, conductively filled and plugged. In comparison to the first method, the interconnection of the second method has higher flexibility. However, via drilling in a highly filled mold content is a difficult process. Filling the vias is very difficult due to the undercut and high filler content of the mold compound. Therefore, large via diameters may be needed due to the filler content in the mold compound. The process is slow and costly, and is not a typical thin-film processes and may not be available as part of standard fabrication technology. Therefore, yield may be low causing even properly functional devices to be scrapped, thus contributing to the cost and even exceeding the cost of scrapping the package slot, e.g. the package via. In comparison, the first method offers a relatively simple process and standard fabrication tools, e.g. equipment and processes are available and may be used. However, the process may be less flexible than the first method and the mold and mold frame may consume more space.

It is an aim to generate a cost effective three-dimensional interconnection from the base ePoP package to a device above the base ePOP package which alleviates the problems of via filling while creating the opportunity for a smaller chip package.

SUMMARY

An embodiment is a chip-packaging module for a chip including an isolation material configured to cover a chip on at least one side, the isolation material having a first surface proximate to a first side of a chip, and said isolation material having a second surface facing an opposite direction to the first surface; and at least one layer in connection with the chip first side, the at least one layer further configured to extend from the chip first side to the second surface of the isolation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. The word "exemplary" is used herein to mean "serving as an example, instance, or illustration". Any embodiment or design described herein as "exemplary" is not necessarily to be construed as preferred or advantageous over other embodiments or designs.

Various embodiments provide for the use of standard thin-film technology to connect the bottom side of the package to the top side. This may be realized by a bevel cut in the bottom side of the package after the eWLB reconstitution.

Figure 4A:
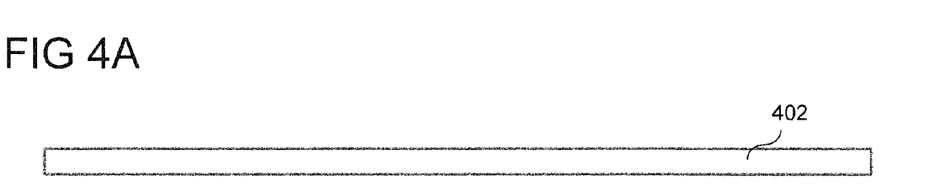
FIGS. 4A to 4E show an overmolding process used for forming a chip-packaging module according to an embodiment.
Figure 4B:
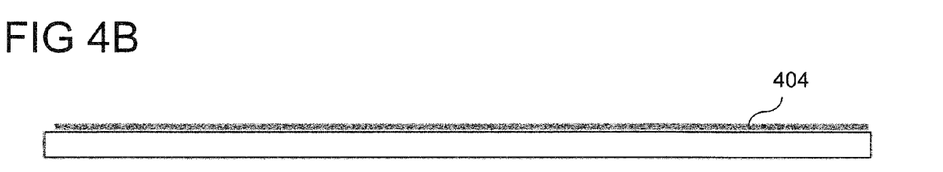
Figure 4C:
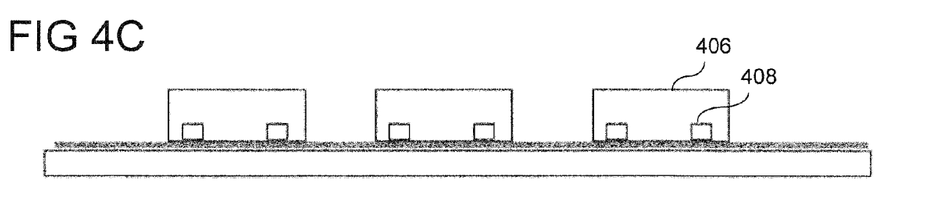
Figure 4D:
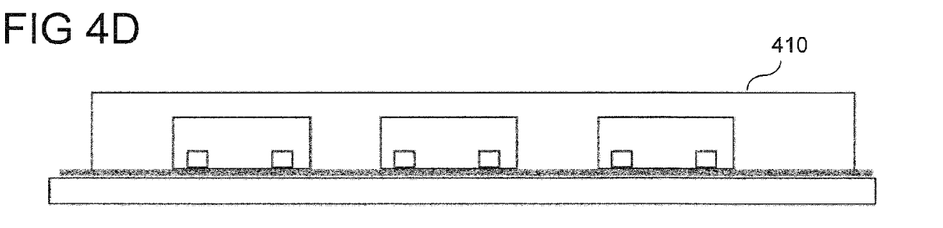
Figure 4E:
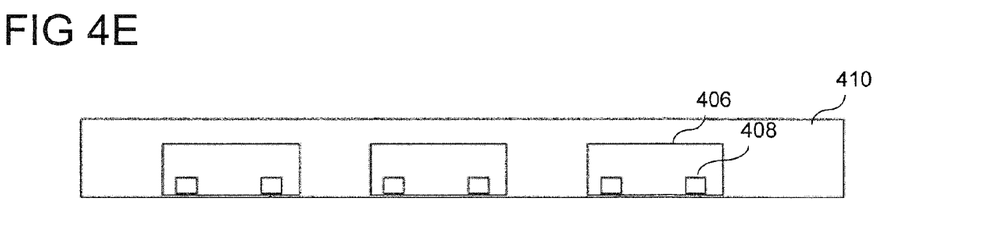

FIGS. 4A to 4E show illustrations of a standard overmolding process which may be used according to an embodiment. A carrier 402, e.g. a metal, silicon or a polymer may be selected, and an adhesive foil 404 may be laminated onto the carrier surface shown in FIG. 4B, wherein the adhesive foil 404 may be a double sided adhesive and may be easily releasable from a surface. A pick-and-place process places preferably FE-tested good dies or chips 406 including interconnections 408 onto the surface of the adhesive foil 404, shown in FIG. 4C. Overmolding may then be carried out as shown in FIG. 4D using an isolation material 410 such as a standard mold compound to isolate the die 406. The adhesive foil 404 may be removed from the chips, releasing the foil and carrier from the adhered dies, as shown in FIG. 4E.

The overmolding process as described with respect to FIGS. 4A to 4E may be used to embed a die or chip in a mold compound. In the second method described above, vias formed by laser drilling or etching in the mold compound may be typically carried out after the overmolding processes described with respect to FIGS. 4A to 4E.

FIGS. 5A to 5I show illustrations of a method for forming a chip-packaging module according to various embodiments. In this description the term "over" can be taken to mean "directly on" or "indirectly on".

According to an embodiment, after an overmolding process such as a process described with respect to FIGS. 4A to 4E, a chip or semiconductor die 406 may be embedded in an isolation material 410, as shown according to FIG. 4E. An isolation material 410, e.g. a mold compound may, from the overmolding process be configured to cover a chip 406 on at least one side. Isolation material 410 may be a mold material, e.g. a material selected from a group well known in the art such as a material selected from a group consisting of: epoxy (e.g. in liquid, granulate, or sheet form), thermoset Material, thermoplastic Material.

According to an embodiment, isolation material 410 may be configured to surround chip 406 except on at least part of a first side 520 of chip 406.

According to an embodiment, chip 406 and isolation material 410 configured to cover chip 406 on at least one side, may together form part of an embedded wafer level package 502.

According to an embodiment, isolation material 410 may include first surface 512 and second surface 514 facing an opposite direction 516 to first surface 512 of isolation material 410. First surface 512 of isolation material 410 may be configured to face the same direction 518 as first side 520 of chip 406. First surface 512 of isolation material 410 may be configured to be level with first side 520 of chip 406.

According to an embodiment, first surface 512 and second surface 514 of isolation material 410 may be configured as a bottom and top surface of embedded wafer level package 502 respectively. First side 520 of chip 406 may include at least part of a wafer front side.

According to an embodiment, one or more connection pads 408 may be formed on first side 520 of chip 406 e.g. one or more connection pads 408 may be formed on at least part of a wafer front side.

Figure 5A:
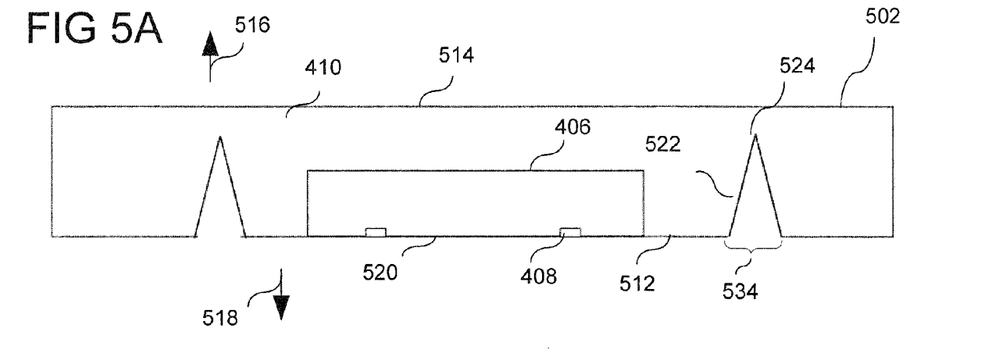
FIGS. 5A to 5I show a method for forming a chip-packaging module in accordance with one embodiment.

According to an embodiment, a recess 524 may be formed at first surface 512 of isolation material 410, e.g. at a bottom side of an embedded wafer level package 502. The recess 524 may be fabricated by a bevel cut at first surface 512 of isolation material 410, as shown in FIG. 5A. More precisely, the recess 524 may include at least one sidewall 522 at an oblique angle to first 512 and/or second 514 surface of isolation material 410, entire sidewall 522 having direct line of sight to an opening 534 at first surface 512 defined by the at least one sidewall 522.

In this context, an oblique angle refers to any angle that is not parallel or perpendicular to first surface 512 or second surface 514 of the isolation material 410.

Direct line of sight to opening 534 may be defined in that sidewall 522 faces opening 534.

Direct line of sight to opening 534 may be defined in that the view, e.g. a view of sidewall 522 in a direction perpendicular to first surface 512 from opening 534 may be substantially unblocked.

Direct line of sight to opening 534 may be defined in that an object, or particles, e.g. Microparticles or nanoparticles directed along an imaginary line perpendicular to first surface 512 from opening 534 defined by sidewall 522, would be unobstructed in meeting sidewall 522, or a layer formed in parallel to sidewall 522.

According to an embodiment, the bevel cut that forms recess 524 may be performed deeper i.e. in direction 516 into isolation material 410, e.g. mold compound, than the thickness of chip 406 as measured in direction 516. More precisely, sidewall 522 of notch 524 may extend further in the direction 516 towards second surface 514 of isolation material 410 than chip 406.

Figure 5B:
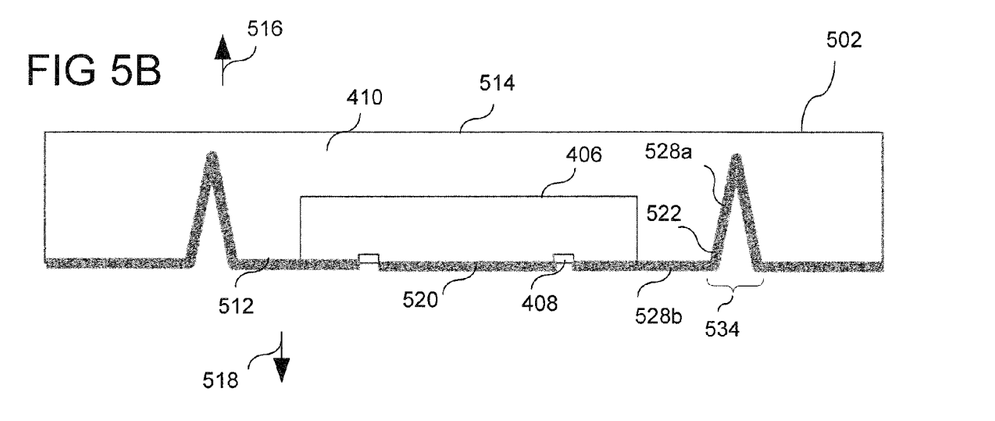

In FIG. 5B, the step of depositing a layer 528a, 528b in connection with a chip first side 520 may then be performed, in accordance with an embodiment. According to an embodiment, layer 528a, 528b may include a thin-film layer. In this context, a thin film layer means any layer having a thickness of between 4 μm and 30 μm.

In FIG. 5B, layer 528a, 528b may be a thin-film passivation layer 528a, 528b, which may be deposited by spin coating, spray coating or by lamination. Thin-film passivation layer 528a, 528b may include portion 528a formed substantially parallel to at least one sidewall 522, and portion 528b formed substantially parallel to isolation material first surface 512. Thin-film passivation layer 528a, 528b may be configured such that thin-film passivation layer 528a, 528b only shortly extends over the chip edge into recess 524. Thin-film passivation layer 528a, 528b may be configured such that portion 528a may comprise a negligible portion, or almost negligible portion of thin-film passivation layer 528a, 528b. Thin-film passivation layer 528a, 528b may be configured to be formed over at least one sidewall 522. Also advantageously, thin-film passivation layer 528a, 528b may be contiguous at the interface between first side 520 and notch 524. According to an embodiment, thin-film passivation layer 528a, 528b may be formed directly on at least one sidewall 522. Thin-film passivation layer may further include portion 528b which may be formed over isolation material first surface 512 and directly on chip first side 520, except ideally in the regions of connection pads 408 formed on first side 520 of chip 406. Thin-film passivation layer 528a, 528b may be a material including a dielectric layer, e.g. pre-pregs (pre-impregnated composite fibers), polyimide, epoxy, silicone or blends.

Because sidewall 522 may be produced by a bevel cut on first surface 512 of isolation material 410, sidewall 522 form an oblique angle to first surface 512 of isolation material 410. In this case, sidewall 522 faces opening 534 defined by sidewall 522 on first surface 512 of isolation material 410. Sidewall 522 has direct line of sight to opening 534 defined by sidewall 522 on first surface 512 of isolation material 410. Therefore, a method, e.g. sputtering may be used to deposit a material, e.g. thin-film passivation layer 528a, 528b, over sidewall 522 and on first surface 512 of isolation material 410. Atoms of the sputter material if approaching first surface 512 of isolation material 410 in a direction 516 normal or perpendicular to first surface 512 of isolation material 410 would be unobstructed in meeting sidewall 522. Therefore, a thin-film layer 528a, 528b may be deposited over sidewall 522 and over first surface 512 of isolation material 410.

Figure 5C:
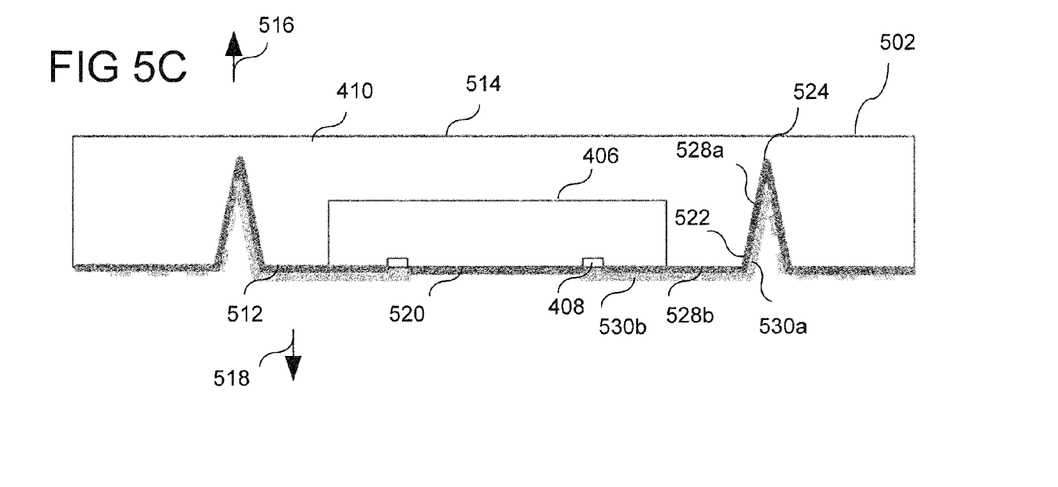

In FIG. 5C, a further layer, electrically conductive thin-film layer 530a, 530b may be configured to be formed over thin-film passivation layer 528a, 528b. Electrically conductive thin-film layer 530a, 530b may be deposited using thin-film deposition techniques, e.g. sputter and/or plating. According to an embodiment, electrically conductive thin-film layer 530a, 530b may be formed directly on thin-film passivation layer 528a, 528b. Electrically conductive thin-film layer 530a, 530b may be configured to be in connection with chip first side 520 and further configured to extend between first surface 512 of isolation material 410 and the second surface 514 of isolation material 410. Electrically conductive thin-film layer 530a, 530b may be configured to be in electrical connection with one or more connection pads 408.

According to an embodiment, electrically conductive thin-film layer 530a, 530b may be deposited in a single step wherein electrically conductive thin-film layer 530a, 530b may be deposited over first surface 512 of the isolation material 410 and at least one sidewall 522. As shown, this layer may extend contiguously from end to end.

According to an embodiment, electrically conductive thin-film layer 530a, 530b may be deposited in a single step wherein electrically conductive thin-film layer 530a, 530b may be deposited directly on thin-film passivation layer 528a, 528b, over first surface 512 of isolation material 410 and at least one sidewall 522.

According to an embodiment, electrically conductive thin-film layer 530a, 530b may include portion 530a formed substantially parallel to at least one sidewall 522, and portion 530b formed substantially parallel to first surface 512 of isolation material 410. According to an embodiment, electrically conductive thin-film layer 530a, 530b may have portion 530b configured as a redistribution layer 530b which may be in electrical connection with one or more connection pads 408 on a chip first side 520 wherein the redistribution layer 530b may be formed in parallel to first surface 512 of isolation material 410.

Due to recess 524 (bevel cut) formed on first surface 512 of the isolation material 410, thin-film passivation layer 528a, 528b formed over (in this case, directly on) sidewall 522 and in parallel to sidewall 522, and further over (directly on) first surface 512 of isolation material 410 faces opening 534 defined by sidewall 522 on first surface 512 of isolation material 410. Thin-film passivation layer 528a, 528b formed over (directly on) sidewall 522 and in parallel to sidewall 522, and further over (directly on) first surface 512 of isolation material 410 has direct line of sight to opening 534 defined by sidewall 522 on first surface 512 of isolation material 410. Therefore, electrically conductive layer 530a, 530b may be deposited on thin-film passivation layer 528a, 528b. In the case of deposition by sputtering for example, the direction of the atoms of sputtered electrically conductive material approaching first surface 512 of isolation material 410 in a direction 516 normal or perpendicular to first surface 512 of isolation material 410 would be unobstructed in meeting thin-film passivation layer 528a formed in parallel over (directly on) sidewall 522. Therefore, electrically conductive thin-film layer 530a would be formed over the sidewall 522 (or directly on thin-film passivation layer portion 528a) and over first surface 152 of the isolation material 410 (directly on thin-film passivation layer portion 528b).

According to an embodiment, thin-film passivation layer 528a, 528b may be configured to isolate electrically conductive thin-film layer 530a, 530b from the chip 406 except where electrically conductive thin-film layer 530a, 530b may be in electrical connection with one or more connection pads 408. According to an embodiment, thin-film passivation layer 528a, 528b may include a thin-film dielectric layer.

According to an embodiment, redistribution layer portion 530b of electrically conductive thin film layer 530a, 530b may connect connection pads 408 to solder balls or to positions wherein solder balls may be later placed. Redistribution layer portion 530b further extends into recess 524 (bevel cut) of isolation material 410.

Figure 5D:
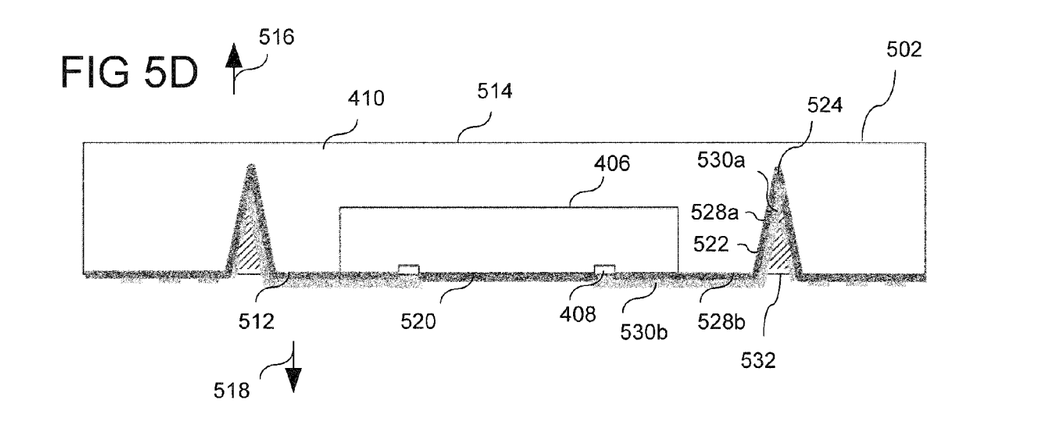

In FIG. 5D, filler material 532 may be deposited. According to an embodiment, filler material 532 may be used to close the recess 524 bevel cut topology. Filler material 532 may be used to fill recess 524 to create a surface of filler material 532 in recess opening 534 level planar with first surface 512 of isolation material 410. Filler material 532 may be deposited by printing, spin coating, spray coating or molding. According to an embodiment, filler material 532 may comprise a mold compound material.

Figure 5E:
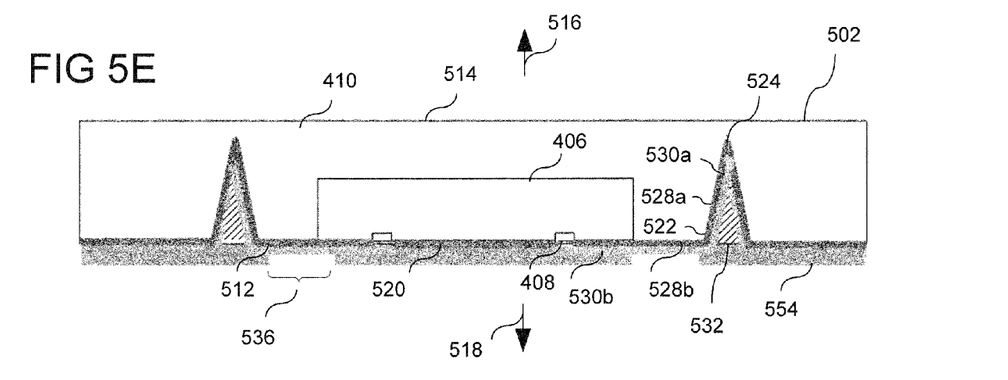

In FIG. 5E, solder stop layer 554 may be applied over first surface 512 of isolation material 410, over filled recess (bevel) opening 534, and over portions of thin-film passivation layer 528b and redistribution layer 530b. According to an embodiment, solder stop layer 554 may be applied over redistribution layer 530b of electrically conductive thin-film layer 530a, 530b, exposing only select portions 536 of redistribution layer 530b. According to an embodiment, solder stop layer 554 may function as filler material 532 for filling recess 524 as describe previously. According to an embodiment, filler material 532 and solder stop layer 554 may be formed from the same material.

Figure 5F:
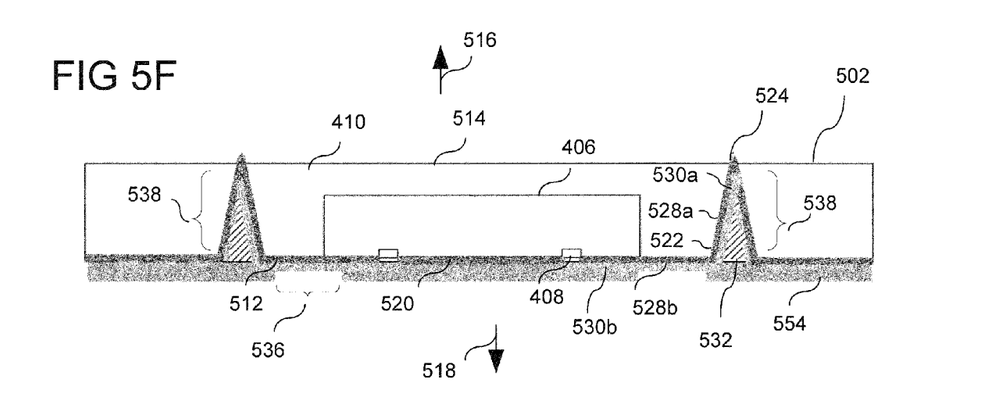

In FIG. 5F, grinding of second surface 514 of isolation material 410 may be carried out, so that a thickness of isolation material 410 from second surface 514 may be reduced. Second surface 514 of isolation material 410, which may be a top side of the embedded wafer level package 502 may be ground down, or thinned, to expose recess 524 region from second surface 514 of isolation material 410. Therefore, electrically conductive thin-film layer 530a, 530b (redistribution layer) may be accessible from second surface 514 (top side) of embedded wafer level package 502.

When recess 524 region is exposed and ground down at second surface 514 of the isolation material 410, recess 524 region may form channel region 538 between first surface 512 and second surface 514 of isolation material 410. According to an embodiment, isolation material 410 may include at least one channel region 538. Channel region 538 may be formed outside, e.g. adjacent chip 406. For example, in FIG. 5F, multiple channel regions 538 of multiple recesses 524 may be configured adjacent to chip 406. Channel regions 538 may be configured to carry at least one layer, e.g. thin-film passivation layer 528a, 528b or electrically conductive thin-film layer 530a, 530b as previously described, in connection with first side 520 of chip 410, between first 512 and second 514 surfaces of isolation material 410. Channel region 538 may include the at least one lateral sidewall 522 described previously, wherein at least one lateral sidewall 522 defines a graduated opening 534 of the at least one channel region 538 between first 512 and second surface 514 of the isolation material 410. According to an embodiment, the graduated opening of at least one channel region 538 has a diameter which increases from second surface 514 to a first surface 512 of isolation material 410.

According to an embodiment, lateral sidewall 522 may be configured as part of at least one channel region 538 having a diameter which increases from second 514 surface to first 65 surface 512 of isolation material 410. According to an embodiment, thin-film passivation layer 528a, 528b, electrically conductive thin-film layer 530a, 530b and filler material 532 may be configured as part of a multilayer connection extending between first 512 and second surface 514 of isolation material 410.

Figure 5G:
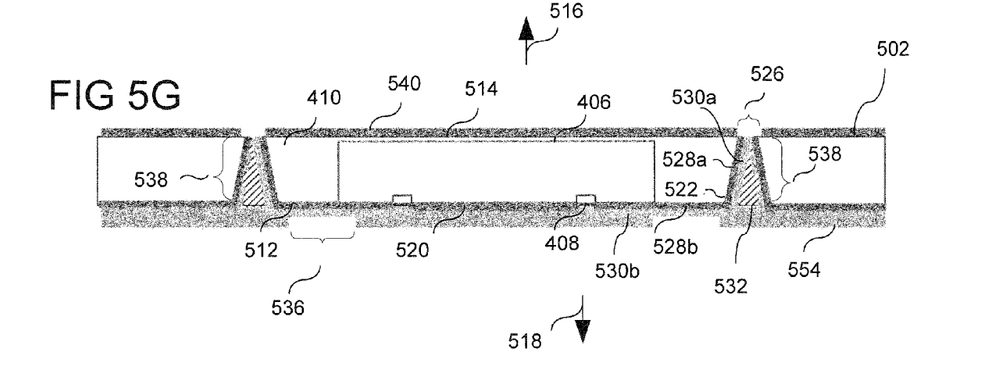

In FIG. 5G, further thin-film passivation layer 540 may be deposited on second surface 514 of isolation material 410 if needed. Further thin-film passivation layer 540 may be deposited by various methods, e.g. spin coating, spray coating, lamination. Further thin-film passivation layer 540 may be deposited directly on second surface 514 except preferably at minor opening 526 of channel region 538 carrying the multilayer connection including thin-film passivation layer 528a, 528b, electrically conductive thin-film layer 530a, 530b and filler material 532 to second surface 514 of isolation material 410.

Figure 5H:
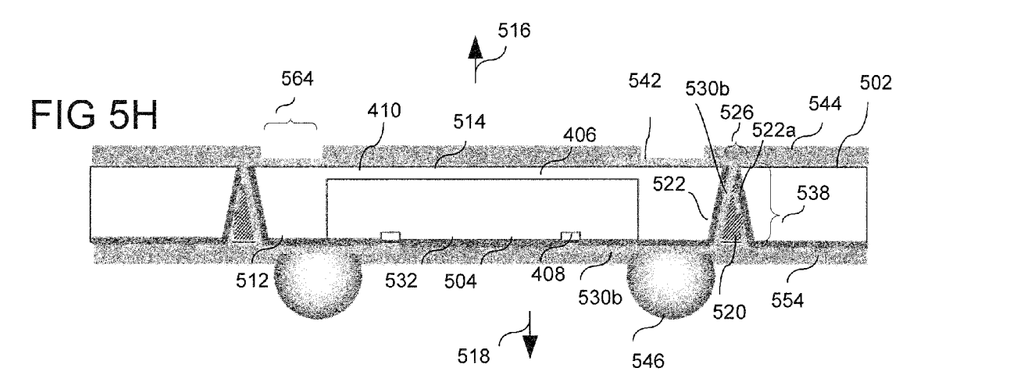

In FIG. 5H, further redistribution layer 542 may be deposited to form an electrical connection with electrically conductive thin-film layer 530a, 530b at minor opening 526 of channel region 538 located at second surface 514 of isolation material 410 (further thin-film passivation layer 540 not shown). According to an embodiment, further redistribution layer 542 may be formed over second surface 514 of isolation material 410.

Further redistribution layer 542 may be formed in parallel to second surface 514 of isolation material 410. Further solder stop layer 544 may be deposited over further redistribution layer 542, exposing only select portions 564 of further redistribution layer 542. On first surface 512 of package 502, solder ball 546 may be applied to select portions 536 of redistribution layer 530b not covered by solder stop layer 554 on first surface 512 of isolation material 410. Chip-packaging module 502 may comprise an embedded wafer level package ball grid array. Chip-packaging module 502 may form part of a package-on-package stack. Therefore, select portions 564 of further redistribution layer 542 may be connected, e.g. electrically connected or contacted with a further package stacked on a higher level, e.g. above second surface 514 of isolation material 410. For example, chip-packaging module 502 may comprise a bottom package while the further package may comprise a top package. Further redistribution layer 542 and further solder stop layer 544 may be applied using standard thin-film technology, e.g. sputtering, evaporation, plating. Electrically conductive layer 530a, 530b, which is also a redistribution layer forms a single connecting layer connecting the first surface 512 of the embedded wafer level package, and second surface 514 of the embedded wafer level package. According to an embodiment, the layer, e.g. electrically conductive layer 530a, 530b, may form an interconnection from an ePOP base or bottom package to a top package. e.g. electrically conductive layer 530a, 530b may be in connection with chip first side 520 of ePOP bottom package 502, and further in connection with further redistribution layer 542 which may be in connection with, e.g. via a solder ball or solder bump or connection pad, a chip first side 520 of a ePOP top package, flip-chip or wire bond ball grid array or any other package type or passive components (e. g. integrated passive devices (IPDs)).

Figure 5I:
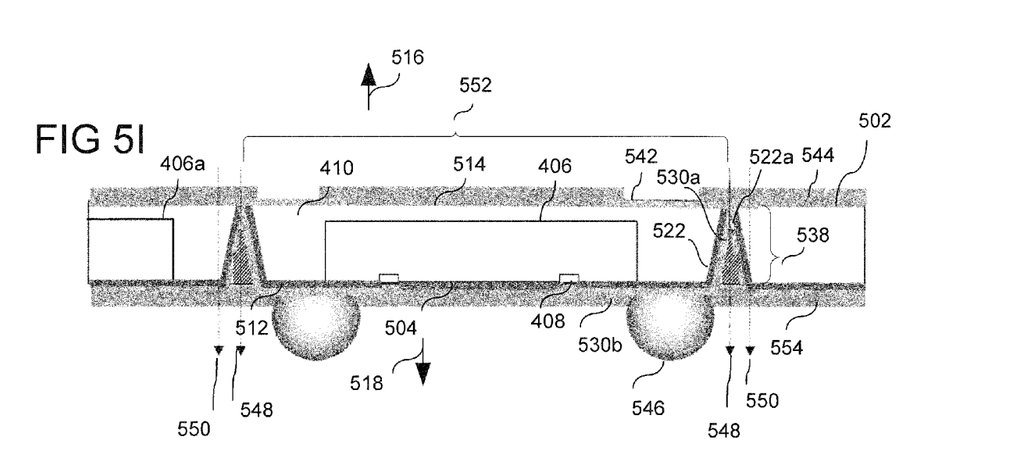

In FIG. 5I, individual chip module 552 may be separated from a neighboring chip module by dicing through channel region 538, e.g. in recess 524/bevel cut, wherein the line of separation 548 by dicing may lie in a direction normal to first 512 and second surface 514 of isolation material 410, e.g. bisecting channel region 538, or at any other pre-defined position 550. Individual chip packages may be checked using optical inspection.

According to an embodiment, channel region 538 may comprise one or more sidewalls wherein a further sidewall has an axis of symmetry with the sidewall 522 about an imaginary line perpendicular to first 510 and second surface 512 of isolation material 410, the imaginary line bisecting channel region 538. For example, channel region 538 may include a plurality of oblique sidewalls, the oblique sidewalls forming a V-shaped recess, or substantially conical shaped recess, comprising the features as previously described.

In this way a wafer packaging module comprising a plurality of chips may comprise a chip 406 as described with respect to FIGS. 5A to 5I, and a laterally adjacent further chip 406a comprising the features of the chip 406 as previously described. Channel region 538 may be configured between the chip 406 and the further chip 406a, the channel region having a first sidewall 522 contiguous the chip, and a further sidewall 522a contiguous the further chip 406a. According to an embodiment, the further multilayer connection arrangement comprising a thin-film passivation layer formed directly on further sidewall and in parallel to further sidewall; thin-film electrically conductive layer formed directly on thin-film passivation layer, over further sidewall and in parallel to further sidewall and thin-film passivation layer; and filler material 532, may be formed over further sidewall 522a. This has the advantage that a plurality of multilayer connections may be formed within a single channel region 538, therefore saving space within a packaging module comprising a plurality of dies or chips.

According to a further embodiment, recess 524 previously described with respect to FIGS. 5A to 5I, may be formed at second surface 514 instead of first surface 512, i.e. at the top side of the package instead of the bottom side. In this further embodiment, further redistribution layer 542 may be deposited in a single step over second surface 514 of isolation material 410 and over a sidewall.

The recess formed at second surface 514 may include at least one sidewall configured at an oblique angle to the second surface 514 of the isolation material 410, bearing the features of the sidewall as previously described, but with respect to the second surface 514 of the isolation material. Further redistribution layer 542 which is also an electrically conductive thin-film layer may be configured to be in connection with a chip, e.g. wherein the chip may be part of a further chip-packaging module above the chip-packaging module. Therefore, further redistribution layer 542 may be configured to be in connection with a chip, e.g. a chip of an above package first side, the further redistribution layer 542 further configured to extend from the chip first side to the first surface of the isolation material.

The method described with respect to FIGS. 5A to 5I introduces a very cost effective means of providing a through-mold connection between a first surface 512 and second surface 514 of isolation material 410 of an embedded wafer level package, i.e. between an embedded wafer level package bottom side and top side. The method produces a very high yield in producing the connection, because the difficult step of having to fill a vertical via may be eliminated and replaced by a connection using thin-film deposition techniques. Therefore, complex methods involving through-mold vias TMV and through-silicon vias TSV may be eliminated. This leads to cost savings in the formation of connections through the mold compound, e.g. costs savings in terms of the amount of material used for the electrical connection, and further cost savings since no additional via features (e.g. via bars) or complex via drill & fills are needed. Furthermore, costs may be reduced with respect to dicing. Chip packages may be traditionally diced to include the entire channel within an individual chip package. With this method, the chip package may be diced through the channel, as each channel carries multiple multilayer connections, therefore saving space and creating a smaller chip package. In addition, low space consumption can be created by the high density channels and very small line spaces of the connections themselves e.g. line space 20/20 produced using thin-film technology using the bevel-cut channels. Furthermore, the via design, e.g. line width and thicknesses may be also easily adaptable to the packaging needs. All process steps are therefore standard semiconductor fabrication steps, wherein the equipment to carry out these methods may be found in standard fabrication laboratories.

The PoP-package structure furthermore creates the possibility to use the complete package top side, e.g. the top side of a bottom package for the routing and landing pads of a top package placed above a bottom package, which is not possible for classical PoP-packages like Flip chip ball grid arrays. Low warpage of eWLB-based packages may be achieved in comparison to standard packages.

Furthermore, unlike traditional methods wherein forming the redistribution layer is a distinctly separate process to forming via filled connectors and/or via bars, (that is, the redistribution layers and through mold connections and/or via bars are not formed during the same processing step, and are not necessarily formed of the same material, or even as an integrated single layer), the current method and devices provide a solution for creating a single integrated thin-film layer which functions as a redistribution layer and as a through-mold thin-film interconnection layer.

The basic functionalities of the features described with respect to FIG. 5 will be referred to and are applicable throughout all the various embodiments which will be described in more detail below. Identical features as to those described in FIG. 5 are denoted with the same reference signs.

Figure 6:
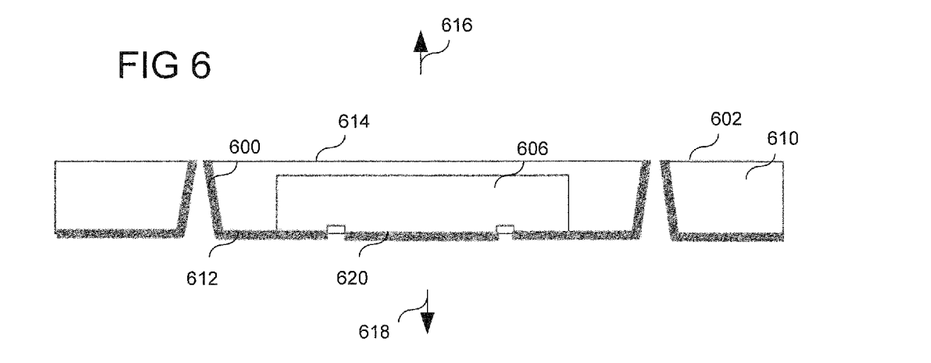
FIG. 6 shows a chip-packaging module in accordance with one embodiment.

FIG. 6 shows illustrations respectively of a chip-packaging module 602 for a chip according to various embodiments.

According to an embodiment, chip-packaging module 602 may include isolation material 610 configured to cover a chip 606 on at least one side, the isolation material having a first surface 612 proximate to a first side 620 of the chip 606, and said isolation material 610 having a second surface 614 facing an opposite direction 616 to the first surface 612; and at least one layer in connection with the chip first side 620, the at least one layer further configured to extend from the chip first side 620 to the second surface 614 of the isolation material 610.

The direction 618 which first surface 612 of isolation material 610 faces may be defined by the direction in which the arrow 618 is pointing. The direction 616 which second surface 614 of isolation material 610 faces may be defined by the direction in which arrow 616 is pointing. According to an embodiment, chip-packaging module 602 may include the basic functionalities and characteristics of the features of chip-packaging module 502 formed as a result of the processing method described with respect to FIGS. 5A to 5I.

The basic functionalities of the features described with respect to FIG. 6 will be referred to and are applicable throughout all the various embodiments which will be described in more detail below. Identical features as to those described in FIG. 6 are denoted with the same reference signs.

Figure 7:
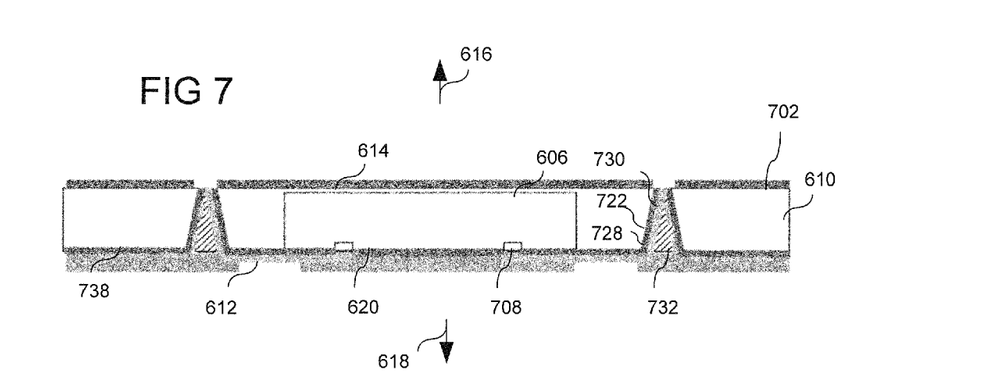
FIG. 7 shows a chip-packaging module in accordance with one embodiment.

FIG. 7 shows illustrations respectively of a chip-packaging module 702 for a chip according to various embodiments.

According to an embodiment, the chip-packaging module 702 may include a chip-packaging module 602 as described with respect to FIG. 6, wherein the chip-packaging module may include an embedded wafer-level packaging module.

According to an embodiment, first surface 612 and second surface 614 of isolation material 610 may be configured as a bottom 612 and top 614 surface of embedded wafer level packaging module 702 respectively.

According to an embodiment, isolation material 610 may be configured to surround chip 606 except on at least part of first side 620 of chip 606.

According to an embodiment, first surface 612 of isolation material 610 may be configured to face the same direction 618 as first side 620 of chip 606.

According to an embodiment, first surface 612 of isolation material 610 may be configured to be level with first side 620 of chip 606.

According to an embodiment, one or more connection pads 706 may be formed on first side 620 of chip 606.

According to an embodiment, at least one layer may be configured over first surface 612 of isolation material 610.

According to an embodiment, the at least one layer may be configured to be in electrical connection with at least one of one or more connection pads 706 formed on first side 620 of chip 606.

According to an embodiment, chip-packaging module 702 may form part of a package-on-package stack.

According to an embodiment, at least one layer may include a thin film layer.

According to an embodiment, at least one layer may include an electrically conductive thin-film layer 730.

According to an embodiment, isolation material 610 may be a mold material.

According to an embodiment, isolation material 610 may be a material selected from a group consisting of: filled or unfilled epoxy, pre-pregs (pre-impregnated composite fibers), laminate, thermoset or thermoplastic material.

According to an embodiment, isolation material 610 may include at least one lateral sidewall 722 configured to carry at least one layer between first 612 and second 614 surfaces of isolation material 610.

According to an embodiment, at least one lateral sidewall 722 may be configured at an oblique angle to first 612 or second surface 614 of isolation material 610.

According to an embodiment, lateral sidewall 722 may be configured as part of at least one channel region 738 extending between first 612 and second 614 surfaces of isolation material 610, wherein the diameter of channel region 738 increases from second surface 614 to first surface 612 of the isolation material.

According to an embodiment, at least one layer in connection with chip first side 620 is configured as part of a multilayer connection extending between first 612 and second surface 614 of isolation material 610.

According to an embodiment, at least one layer may be configured to lie in parallel to at least one sidewall 722.

According to an embodiment, at least one layer may include a thin-film passivation layer 728.

According to an embodiment, the multilayer connection may include a filler material 710.

According to an embodiment, thin-film passivation layer 728 may be configured to be formed over at least one sidewall 722 of channel region 738.

According to an embodiment, electrically conductive thin-film layer 730 may be configured to be formed over thin-film passivation layer 728.

According to an embodiment, chip 606 may include a semiconductor die.

According to an embodiment, layer may be further configured to be formed in parallel to a first 612 or second 614 surface of isolation material 610.

According to an embodiment, electrically conductive thin-film layer 730 may be further configured as a redistribution layer.

According to an embodiment, redistribution layer may be formed in parallel to a first 612 or second 614 surface of the isolation material.

According to an embodiment, filler material 732 may be a mold material.

According to an embodiment, first side 620 of chip 606 may include at least part of a wafer front side.

According to an embodiment, at least one layer may form an interconnection from an ePOP base or bottom package to a top package.

Figure 8:
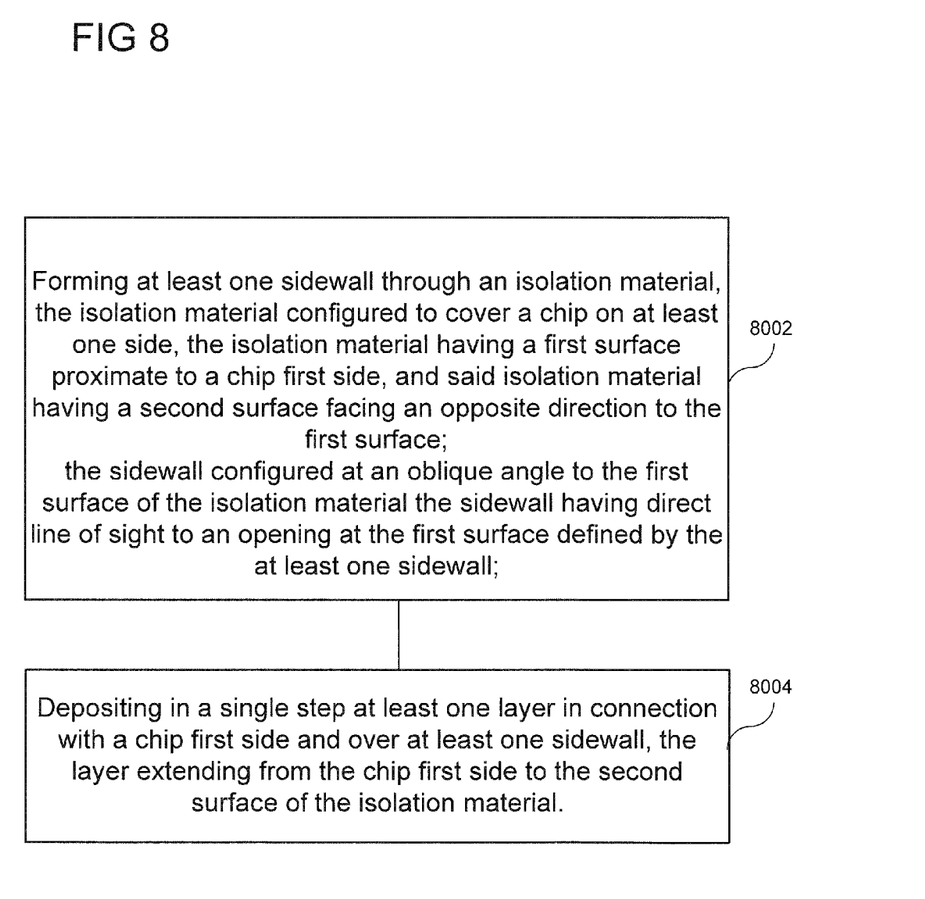
FIG. 8 shows a method for forming a chip-packaging module in accordance with one embodiment.

FIG. 8 shows an illustration of a method for forming a chip-packaging module including:

a step 8002 of forming at least one sidewall through an isolation material, the isolation material configured to cover a chip on at least one side, the isolation material having a first surface proximate to a chip first side, and said isolation material having a second surface facing an opposite direction to the first surface;

the sidewall configured at an oblique angle to the first surface of the isolation material the sidewall having direct line of sight to an opening at the first surface defined by the at least one sidewall;

a step 8004 of depositing in a single step at least one layer in connection with a chip first side and over at least one sidewall, the layer extending from the chip first side to the second surface of the isolation material.

The method therefore uses a bevel cut on package bottom side in conjunction with thin-film technology to realize a connection from the bottom side to the top side of an embedded wafer level package (eWLB) and embedded package-on-package applications.

Figure 9:
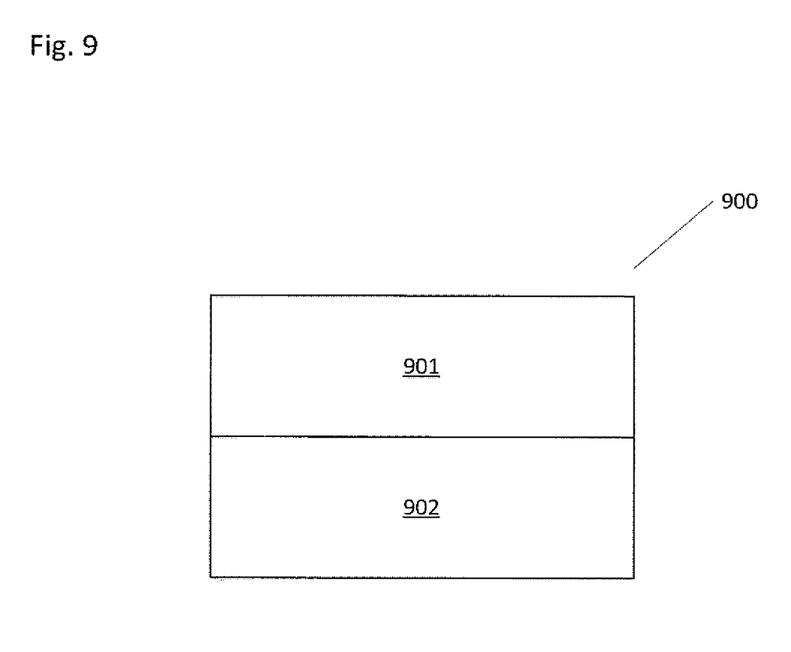
FIG. 9 shows a package-on-package stack in accordance with one embodiment.

FIG. 9 shows a package-on-package (POP) stack 900 in accordance with one embodiment. The package-on-package stack 900 may include a first chip-packing module 901 arranged above a second chip-packaging module 902. First chip-packing module 901 may be connected with second chip-packing module 902. According to an embodiment first chip-packing module 901 and/or second chip-packing module 902 may be configured as described with respect to FIG. 7.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip-packaging module for a chip comprising:
an isolation material configured to cover a chip on at least one side, the isolation material having a first surface proximate to a first side of the chip, and said isolation material having a second surface facing an opposite direction to the first surface; and
at least one layer in connection with the chip first side, the at least one layer further configured to extend from the chip first side through an entire thickness of the isolation material to the second surface of the isolation material, wherein the at least one layer comprises a thin-film passivation layer.

2. The chip-packaging module according to claim 1, wherein the chip-packaging module comprises an embedded wafer-level packaging module.

3. The chip-packaging module according to claim 2, wherein the first surface and second surface of the isolation material are configured as a bottom side and top side of the embedded wafer level packaging module respectively.

4. The chip-packaging module according to claim 1, wherein the isolation material is configured to surround the chip except on at least part of the first side of the chip.

5. The chip-packaging module according to claim 4, wherein the first surface of the isolation material is configured to face the same direction as the first side of the chip.

6. The chip-packaging module according to claim 4, wherein one or more connection pads are formed on the first side of the chip.

7. The chip-packaging module according to claim 6, wherein the at least one layer is configured to be in electrical connection with at least one of the one or more connection pads formed on the first side of the chip.

8. The chip-packaging module according to claim 1, wherein the chip-packaging module forms part of a package-on-package stack.

9. The chip-packaging module according to claim 1, wherein the isolation material is a mold material.

10. The isolation material according to any of claim 1, wherein the isolation material is a material selected from a group consisting of: filled or unfilled epoxy, pre-impregnated composite fibers (pre-pregs), laminate, thermoset or thermoplastic material.

11. The chip-packaging module according to any of claim 1, wherein the at least one layer further comprises an electrically conductive thin-film layer.

12. The chip-packaging module according to claim 1, the isolation material comprising at least one lateral sidewall configured to carry the at least one layer between the first and second surfaces of the isolation material.

13. The chip-packaging module according to claim 12, wherein the at least one lateral sidewall is configured at an oblique angle to a first or second surface of the isolation material.

14. The chip-packaging module according to claim 12, wherein the lateral sidewall is configured as part of the at least one channel region extending between the first and second surfaces of the isolation material, wherein the diameter of the channel region increases from the second surface to the first surface of the isolation material.

15. The chip-packaging module according to claim 1, wherein the at least one layer is configured to lie in parallel to the at least one sidewall.

16. The chip-packaging module according to claim 1, wherein the at least one layer in connection with a chip first side is configured as part of a multilayer connection extending between the first and second surface of the isolation material.

17. The chip-packaging module according to claim 1, wherein the thin-film passivation layer is configured to be formed over at least one sidewall of a channel region.

18. The chip-packaging module according to claim 11, wherein the electrically conductive thin-film layer is formed on the thin-film passivation layer.

19. The chip-packaging module according to claim 11, wherein the electrically conductive thin-film layer is further configured as a redistribution layer.

20. The chip-packaging module according to claim 16, wherein the multilayer connection comprises a filler material.

21. The chip-packaging module according to claim 20, wherein the filler material is a mold material.

22. The chip-packaging module according to claim 1, wherein the first side of the chip comprises at least part of a wafer front side.

23. The chip-packaging module according to claim 1, wherein the at least one layer is configured over a first surface of the isolation material.

* * * * *